US008890508B2

(12) United States Patent
Blake et al.

(10) Patent No.: US 8,890,508 B2
(45) Date of Patent: Nov. 18, 2014

(54) ADAPTIVE FILTERS FOR FIBER OPTIC SENSORS

(75) Inventors: James N. Blake, Paradise Valley, AZ (US); Carl Glasow, Phoenix, AZ (US)

(73) Assignee: Alstom Technology Ltd, Baden (CH)

( * ) Notice: Subject to any disclaimer, the term of this patent is extended or adjusted under 35 U.S.C. 154(b) by 1360 days.

(21) Appl. No.: 12/598,651

(22) PCT Filed: May 2, 2008

(86) PCT No.: PCT/US2008/062377
§ 371 (c)(1),
(2), (4) Date: Feb. 23, 2010

(87) PCT Pub. No.: WO2008/137651
PCT Pub. Date: Nov. 13, 2008

(65) Prior Publication Data
US 2011/0204875 A1    Aug. 25, 2011

Related U.S. Application Data

(60) Provisional application No. 60/927,609, filed on May 4, 2007.

(51) Int. Cl.
*G01R 13/04* (2006.01)
*G01R 15/24* (2006.01)

(52) U.S. Cl.
CPC .................. *G01R 15/247* (2013.01)
USPC ........... 324/96; 324/97; 324/244.1; 356/450; 356/464; 385/12

(58) Field of Classification Search
USPC .......................... 385/483; 324/244.1; 356/464
See application file for complete search history.

(56) References Cited

U.S. PATENT DOCUMENTS 4,545,682 A * 10/1985 Greenwood ................ 356/464
5,644,397 A *  7/1997 Blake ........................ 356/483

(Continued)

FOREIGN PATENT DOCUMENTS

| CN | 1434299 A | 8/2003 |
| CN | 1774862 A | 5/2006 |

(Continued)

OTHER PUBLICATIONS

Nehorai, Arye et al, "Adaptive Comb Filtering for Harmonic Signal Enhancement," IEEE Transactions on Acoustics, Speech and Signal Processing, IEEE Inc., New York, USA, vol. ASSP-34, No. 5, Oct. 1, 1986, pp. 1124-1138.*

(Continued)

*Primary Examiner* — Richard Isla Rodas
(74) *Attorney, Agent, or Firm* — Patent Portfolio Builders PLLC

(57) ABSTRACT

Systems and methods related to optical current and voltage sensors and, more particularly, to filters for use in such sensors. A fiber optic current sensor comprising: a light source; a polarization beam splitter connected to said light source having a reciprocal port and a non-reciprocal port; a Faraday rotator connected to said polarization beam splitter; a first quarter-wave plate connected to said Faraday rotator; a polarization maintaining fiber connected to said first quarter-wave plate; a second quarter-wave plate connected to said polarization maintaining fiber; a sensing fiber connected to said second quarter-wave plate; a detector connected to said polarization beam splitter via said non-reciprocal port and having an output; and an adaptive filter for filtering said output.

17 Claims, 6 Drawing Sheets

(56) References Cited

U.S. PATENT DOCUMENTS

| | | | |
|---|---|---|---|
| 5,696,858 A * | 12/1997 | Blake | 385/12 |
| 5,811,964 A * | 9/1998 | Bosselmann et al. | 324/96 |
| 5,987,195 A * | 11/1999 | Blake | 385/12 |
| 6,046,810 A * | 4/2000 | Sanders et al. | 356/459 |
| 6,122,415 A * | 9/2000 | Blake | 385/12 |
| 6,188,811 B1 * | 2/2001 | Blake | 385/12 |
| 6,563,589 B1 * | 5/2003 | Bennett et al. | 356/483 |
| 6,763,153 B2 * | 7/2004 | Bennett | 385/12 |
| 7,038,783 B2 * | 5/2006 | Standjord et al. | 356/460 |
| 7,038,786 B2 * | 5/2006 | Blake | 356/483 |
| 7,102,757 B2 * | 9/2006 | Spahlinger et al. | 356/483 |
| 2005/0231871 A1 | 10/2005 | Ghartemani | |
| 2007/0065156 A1 * | 3/2007 | Lin et al. | 398/152 |

FOREIGN PATENT DOCUMENTS

| | | |
|---|---|---|
| KR | 20-0309065 Y1 | 3/2003 |
| WO | 99/50678 A2 | 10/1999 |
| WO | 03/034009 A2 | 4/2003 |
| WO | 03/065057 A1 | 8/2003 |
| WO | 2007/033057 A2 | 3/2007 |
| WO | 2007033057 A2 | 3/2007 |

OTHER PUBLICATIONS

Supplemental European Search Report issued in corresponding European patent application No. 08 74 7471, date of completion Mar. 28, 2013.

Nehorai, Arye et al, "Adaptive Comb Filtering for Harmonic Signal Enhancement," IEEE Transactions on Acoustics, Speech and Signal Processing, IEEE Inc., New York, USA, vol. ASSP-34, No. 5, Oct. 1, 1986, pp. 1124-1138, XP000676140, ISSN: 0096-3518, DOI: 10.1109/TASSP.1986.1164952.

International Search Report from corresponding International Application No. PCT/US2008/062377.

Chinese Office Action in corresponding Chinese Application No. 200880014726.3 dated Aug. 5, 2011.

Chinese Office Action in corresponding Chinese Application No. 200880014726.3 dated Aug. 14, 2013.

\* cited by examiner

ADAPTIVE FILTERS FOR FIBER OPTIC SENSORS

RELATED APPLICATION

This application is related to, and claims priority from, U.S. patent application Ser. No. 60/927,609, filed on May 4, 2007 entitled "Adaptive Filters for Fiber Optic Sensors", the disclosure of which is incorporated here by reference.

BACKGROUND

The present invention pertains to fiber optical current and voltage sensors and, more particularly, to adaptive filters for use in such sensors.

One important aspect of electrical power systems deployed by the power generation industry is the ability to measure power carried over high voltage transmission lines. Power measurement has typically been performed on the high voltage side of the systems before the voltage is stepped down for distribution. However, the need is growing for more frequent and more accurate power measurements (e.g., voltage and current measurements) throughout the power distribution systems. Some recent innovations associated with making such power measurements involve the use of fiber optic sensors.

For example, fiber optic current sensors operate based on the Faraday effect. Current flowing in a wire induces a magnetic field which, through the Faraday effect, rotates the plane of polarization of the light traveling in the optical fiber wound around the current carrying wire. Faraday's law can be stated as:

$$I = \oint H \, dL \quad (1)$$

where I is the electrical current, H is the magnetic field and the integral is taken over a closed path around the current. If the sensing fiber is wound around the current carrying wire with an integral number of turns, and each point in the sensing fiber has a constant sensitivity to the magnetic field, then the rotation of the plane of polarization of the light in the fiber depends on the current being carried in the wire and is insensitive to all externally generated magnetic fields such as those caused by currents carried in nearby wires. The angle, $\Delta\Phi$, through which the plane of polarization of light rotates in the presence of a magnetic field is given by:

$$\Delta\Phi = V \oint H \, dL \quad (2)$$

where V is the Verdet constant of the fiber glass.

The sensing optical fiber performs the line integral of the magnetic field along its path, which is proportional to the current in the wire, when that path closes on itself. Thus, $\Delta\Phi = VNI$ where N is the number of turns of sensing fiber wound around the current carrying wire. The rotation of the state of polarization of the light due to the presence of an electrical current can be measured by injecting light with a well-defined linear polarization state into the sensing region, and then analyzing the polarization state of the light after it exits the sensing region. Alternatively, $\Delta\Phi$ represents the excess phase shift encountered by a circularly polarized light wave propagating in the sensing fiber.

This technology is related to the in-line optical fiber current sensor as disclosed in U.S. Pat. No. 5,644,397 issued Jul. 1, 1997, to inventor James N. Blake and entitled "Fiber Optic Interferometric Circuit and Magnetic Field Sensor", which is incorporated herein by reference. Optical fiber sensors are also disclosed in U.S. Pat. No. 5,696,858 issued Dec. 9, 1997, to inventor James N. Blake and entitled, "Fiber Optics Apparatus and Method for Accurate Current Sensing" and U.S. Patent No. 6,188,811 to James N. Blake and entitled "Fiber Optic Current Sensor", the disclosures of which are incorporated herein by reference.

These types of fiber optic current sensors have, for example, the advantage that they operate over a very wide dynamic range. This gives a single optical current sensor the potential to operate as both a protection device as well as a metering device. Applications in some power lines require the capability to measure currents as high as 170 kA and to handle transient currents with accuracies to within a few percent, while at the same time being able to measure a 1 A current level to within a few tenths of a percent accuracy. Other applications require wide dynamic range measurements of rms current. Still other applications require accurate measurements of a wide range of current harmonics in addition to the fundamental power frequency current for power quality determination.

In all of these exemplary applications, the fiber optic current sensor relies on its inherent linear and wide bandwidth operation to faithfully capture the true current values. However, the fiber optic current sensor also adds white noise to the sensed current. This noise can be electronic noise, but also contains a component of shot noise associated with the optical sensing mechanism. The presence of noise limits the functionality of the sensor to meet the aforementioned applications, especially when the true currents are at the low end of the dynamic range. In some cases, more sophisticated signal processing in the receiving instruments could allow for the white noise of the fiber sensor to be filtered out, and thus be of essentially no consequence for the application. However, because the receiving instruments were not designed with fiber sensors in mind, they do not always filter out the white noise, and thus yield erroneous measurements. For example, if the noise is of significant value compared to the true current, rms current calculations can be in gross error if the noise is not filtered out.

One way to address this noise issue is to carefully configure the number of fiber sensing turns, and the sensor bandwidth in the fiber optic current sensor to optimize the signal, noise, and linearity to the application. However, this approach leaves such a fiber optic current sensor potentially unable to achieve a full range of application, and also is not optimum from a cost perspective, as it requires the use of many turns of costly sensing fiber when the currents to be sensed are small. In addition, the number of sensing turns cannot easily be changed once the sensor is put into operation, so it is difficult to re-optimize the sensor once it has been installed.

Accordingly, it would be desirable to provide optical current (and voltage) sensors and sensing methods which address the foregoing issues.

SUMMARY

Systems and methods according to the present invention address this need and others by providing systems and methods related to fiber optical current and voltage sensors and, more particularly, to adaptive filters for use in such sensors.

According to one exemplary embodiment a fiber optic current sensor includes: a light source; a polarization beam splitter connected to the light source having a reciprocal port and a non-reciprocal port; a Faraday rotator connected to the polarization beam splitter; a first quarter-wave plate connected to the Faraday rotator; a polarization maintaining fiber connected to the first quarter-wave plate; a second quarter-wave plate connected to the polarization maintaining fiber; a sensing fiber connected to the second quarter-wave plate; a detector connected to the polarization beam splitter via said non-reciprocal port and having an output; and an adaptive filter for filtering the output.

According to another exemplary embodiment a device used in conjunction with a fiber optic current or voltage sensor, the device includes: a splitter for splitting the incoming signal; a comb filter; a comparator for comparing a raw signal to a comb filtered signal and wherein the comparator determines a weighting value; a first gain block for modifying a signal output from the frequency tracking comb filter; a second gain block for modifying the raw signal; and a summer for creating a processed signal from the outputs of the first and second gain blocks.

According to another exemplary embodiment a method for sensing current or voltage on a high power voltage line with an adaptive filter includes: filtering a raw signal in a comb filter, wherein the comb filter outputs a filtered signal; comparing the raw signal to the filtered signal by a comparator and outputting a weighting factor; modifying the filtered signal based upon the weighting factor; modifying the raw signal based upon the weighting factor; and summing the modified filtered signal and the modified raw signal resulting in a processed signal.

According to another exemplary embodiment, a fiber optic current sensor includes a source which generates light, a biasing element for biasing the light, a polarization maintaining fiber connected to the biasing element, a quarter-wave plate connected to the polarization maintaining fiber, a sensing fiber connected to the quarter-wave plate, a reflector connected to the sensing fiber, a coupler connected to the light source and to a detector, wherein the detector receives light returning from the reflector and generates an output associated therewith, and an adaptive filter for filtering the output.

According to another exemplary embodiment, an optical sensing device includes at least one of an optical current sensor for sensing current and an optical voltage sensor for sensing voltage, and a frequency tracking comb filter for filtering an output of the at least one of an optical current sensor for sensing current and an optical voltage sensor for sensing voltage.

According to still another exemplary embodiment, an optical sensing device includes at least one of an optical current sensor for sensing current and an optical voltage sensor for sensing voltage, and an adaptive filter which reduces the frequency response of an output of said at least one of an optical current sensor for sensing current and an optical voltage sensor for sensing voltage in response to a reduction in the magnitude of said output.

BRIEF DESCRIPTION OF THE DRAWINGS

The accompanying drawings illustrate exemplary embodiments of the present invention, wherein.

DETAILED DESCRIPTION

The following detailed description of the invention refers to the accompanying drawings. The same reference numbers in different drawings identify the same or similar elements. Also, the following detailed description does not limit the invention. Instead, the scope of the invention is defined by the appended claims.

In order to provide some context for this discussion, an exemplary fiber optic current sensor disclosed is illustrated as FIG. 1 and described below. However it will be appreciated that filtering devices and techniques according to these exemplary embodiments are not limited to use in this particular sensor configuration and may be used in other fiber optic current and voltage sensors. For example, such filtering devices and techniques can also be used in the in-line optical current sensor described in the above-incorporated by reference '397 patent or in a time division multiplexed optical voltage measuring system such as that disclosed in U.S. Pat. No. 7,009,378, the disclosure of which is also expressly incorporated by reference herein.

Figure 1:
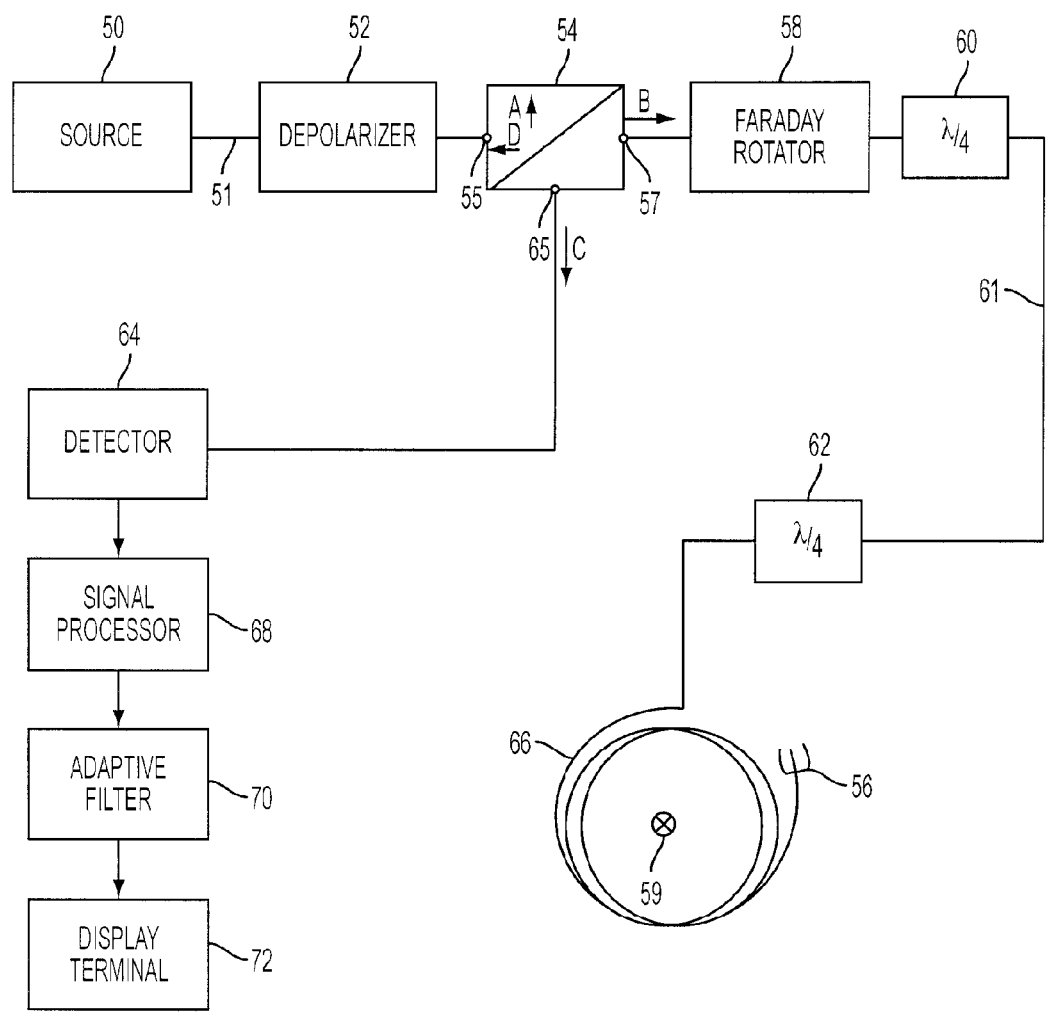
FIG. 1 depicts an optical current sensor including an adaptive filter according to an exemplary embodiment.

In FIG. 1, a light source 50 (e.g., a superluminescent diode (SLED)) emits light having a random polarization state which is coupled into a single mode (SM) optical fiber 51. The light is optionally depolarized by depolarizer 52 such that the polarization state of the light output from depolarizer 52 contains about one-half light having a first linear polarization state and the remainder of the light having a second linear polarization state which is orthogonal to the first linear polarization state.

The depolarized light travels on to the polarization beam splitter (PBS) 54 where it enters through port 55. The polarization beam splitter 54 operates to split the depolarized light into its two orthogonal polarization components. One polarization component (represented by arrow A) is reflected back from a splitting junction within the PBS 54 and is substantially scattered within the device (although some light could be reflected back through the port 55) and the other polarization component (represented by arrow B) is transmitted through port 57 of the PBS. Thus, in the forward propagation direction (i.e., from the source 50 to the reflective termination 56), the PBS 54 operates as a polarizer such that light having a single linear polarization state is conveyed to Faraday rotator 58.

The linearly polarized light which is incident upon the Faraday rotator 58 can be viewed as two, substantially equal, circularly polarized component waves, e.g., a right-hand circularly (RHC) polarized component wave and a left-hand circularly (LHC) polarized component wave. The Faraday rotator 58 operates to passively introduce a bias between the RHC component wave and the LHC component wave in order to improve the sensitivity of the detector to the amount of current flowing through wire 59. In this exemplary embodiment, the Faraday rotator 58 introduces a phase shift of +22.5 degrees to one of the RHC and LHC component waves and a phase shift of −22.5 degrees to the other of the RHC and LHC component waves. The biased light energy is then output to quarter-wave plate (λ/4) 60 which operates as a mode converter to convert the circularly polarized light to linearly polarized light.

The linearly polarized light is then conveyed via a polarization maintaining (PM) fiber 61 to another quarter-wave plate 62 which operates as a mode converter to convert the linearly polarized light back into circularly polarized light. The quarter-wave plate 60, PM fiber 61 and quarter-wave plate 62 are provided as a mechanism to aid in maintaining the polarization states (and more significantly the relative phase shift between the polarization components) of the light since the detector 64 operates to detect this phase shift, from which the magnitude of the current flowing through conductor 59 is determined. Depending upon the particular implementation of fiber optic current sensors according to these exemplary embodiments, the PM fiber 61 may have a length of anywhere from a meter or two to several hundred meters, over which length it is useful to maintain the polarization states of the components and the phase shift information. Linear polarization is employed in this exemplary embodiment for conveying the light over this part of the system because it is less sensitive to magnetic and stress effects which tend to degrade the purity of the polarization state of the light's component waves.

After the circularly polarized light is output from quarter-wave plate 62, it enters a sensing fiber 66 which encircles the wire 59 whose current is being monitored. The detector 64 achieves its greatest sensitivity when the circular states of polarization are well maintained throughout the sensing fiber 66. The current running through conductor 59 will introduce an additional phase shift between the RHC and LHC polarization component waves of the light passing through sensing fiber 66 according to $\Delta\Phi=VNI$, cumulatively 2VNI. The light will then reach reflective termination 56, e.g., a mirror, where it is reflected back through the sensing fiber 66 to quarter-wave plate 62. During the reverse propagation through sensing fiber 66, the RHC and LHC component waves of the light will acquire a second phase shift therebetween of 2VNI, for a total in the two passes of 4VNI. This second phase shift will be cumulative to the first phase shift (rather than offset it) because the polarization sense of the RHC and LHC component waves reverse upon incidence at the reflective termination and, on the reverse path, the light passes through the magnetic field generated by the current running through conductor 59 in the opposite direction.

The light will be converted back into linearly polarized light, by quarter-wave plate 62, for the return trip through PM fiber 61, and again back into circularly polarized light by quarter-wave plate 60. The light will be phase shifted again by Faraday rotator 58 such that the cumulative phase shift introduced between the RHC and LHC component waves is 90 degrees +4VNI. The light output from the Faraday rotator 58 then proceeds on to PBS 54. Some portion of the light output from the Faraday rotator 58 (an amount which depends upon the cumulative phase shift introduced along the forward and reverse paths) will have a polarization that causes it to be reflected from the path axis of the Faraday rotator 58 and directed out through the port 65 of the PBS 54 toward detector 64 (as represented by the arrow C in FIG. 1). The remainder of the light will be transmitted back through the port 55 of the PBS 54 toward the source 50 (as represented by the arrow D in FIG. 1) and can be isolated or dumped as desired. In this context, port 65 is the "non-reciprocal port" of PBS 54 since the light represented by arrow C is exiting the PBS 54 through a different port on its return path than the port (port 55) through which it entered the PBS 54 along the forward path. Conversely, the portion of the return light represented by arrow D exits the PBS 54 through the reciprocal port 55. Exemplary embodiments of the present invention detect the intensity of light returned through the non-reciprocal port of a polarization beam splitter.

The detector 64 generates intensity data from which the phase shift between the polarization component waves of the light returned to it via the reverse propagation path is determined. This phase shift will be related to the current passing through the conductor 59 and can, therefore, be used to output a current measurement associated therewith. For example, detector 64 can be connected to a signal processor 68 (e.g., an open-loop signal processor) for determining, e.g., a 60 Hz current associated with the detected phase shift based upon the detected intensity received from detector 64.

According to exemplary embodiments, the output of signal processor 68 can be adaptively filtered to better preserve the shape of the current's waveform by removing noise effects from the signal processor's output. An adaptive filter 70 is used according to these exemplary embodiment so that a different filtering approach can be taken at different times depending upon the detected magnitude of the signal, i.e., a signal dependent filtering approach. This enables, for example, small magnitude signals (e.g., which are generated during normal operation of a high voltage power line) to be filtered using a first type of filtering and larger magnitude signals (e.g., which are generated during transients or spikes on a high voltage power line) to be filtered using a second, different type of filtering (or no filtering at all). The resulting, filtered waveform can be output to a display terminal associated with, for example, a power quality determining instrument, a power meter or a var meter. A more detailed, exemplary adaptive filter will now be described with respect to FIG. 2.

According to this exemplary embodiment, an adaptive filter 200 removes non-harmonic noise from the output of the current sensor when the true currents are relatively small. Generally, this exemplary embodiment recognizes when the true current is small enough that noise is potentially a problem, and implements a frequency tracking comb filter 202 when this is the case. The comb filter 202 is set to pass all the harmonics of the power frequency up to some preset limit (e.g., the $100^{th}$ harmonic), but rejects all frequency components in between the harmonics. The comb filter 202 also tracks the detected power frequency to ensure that it does not lose the true high harmonics.

Figure 2:
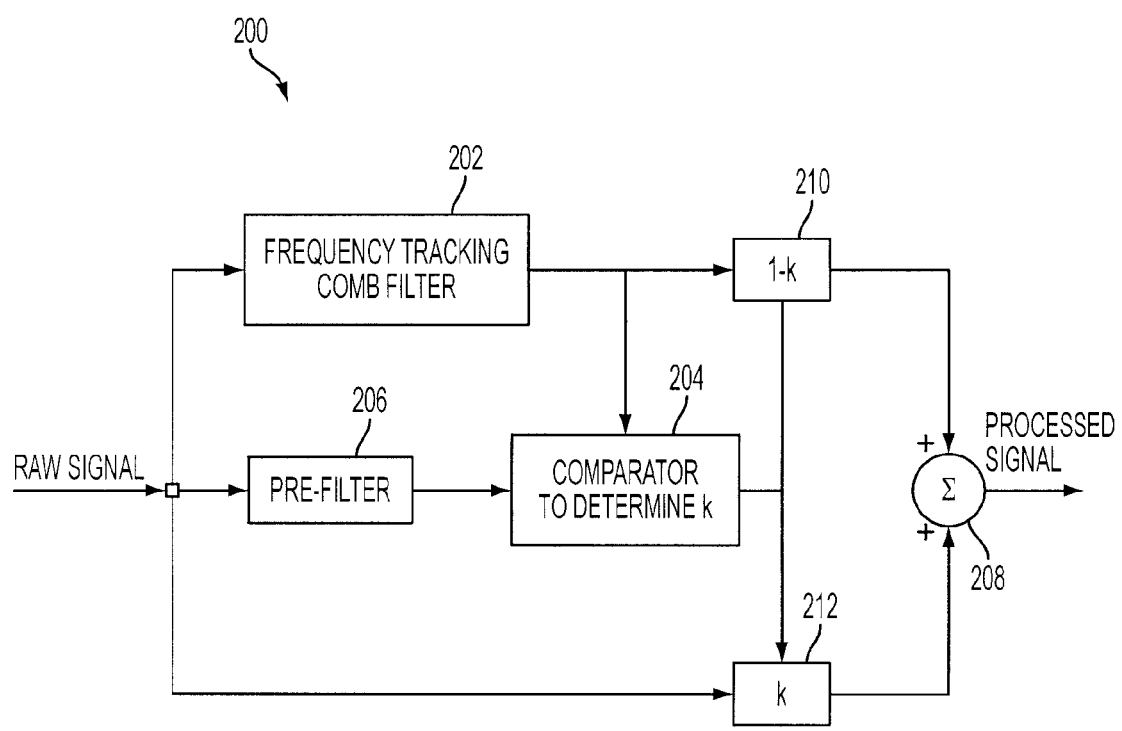
FIG. 2 shows an exemplary adaptive filter in accordance with an exemplary embodiment.

More specifically, FIG. 2 shows a block diagram of the adaptive filter 200 according to an exemplary embodiment. Therein, the raw signal, e.g., the 60 Hz signal received from signal processor 68, is divided into three paths. On the uppermost signal processing path, the frequency tracking comb filter 202 receives the raw signal and continuously outputs a filtered result. The operation of an exemplary comb filter 202 is described in more detail below with respect to FIGS. 3(*a*) and 3(*b*).

In the middle signal processing path shown in FIG. 2 is a comparator 204 for determining k, which is a value which is used by the adaptive filter 200 to weight the relative contributions of the raw signal and the comb filtered signal in the final output generated by summer 208. The raw signal is, optionally, pre-filtered at block 206 using a bandpass filter to remove noise from the signal. As will be described in more detail below with respect to FIGS. 4(*a*) and 4(*b*), the comparator 204 in this exemplary embodiment determines both how close (in magnitude) the comb filtered signal is to the (possibly pre-filtered) raw signal and also the magnitude of the raw signal in determining a value for k. The comb filtered signal's contribution is heavily weighted (i.e., k is relatively small) by gain block 210 in the final output of the adaptive filter 200 when the magnitude of the raw signal is suitably small, and when the comb filtered signal is suitably close to the raw signal. These two conditions make it less likely that the comb filter 202 will filter transients in the measured current, and also that the comb filter 202 will not be used when it is not needed to suppress noise. Conversely, as will be discussed in more detail below, the raw signal's contribution is heavily weighted (i.e., k is relatively large) by gain block 212 when either of these two conditions are not met.

Figure 3A:
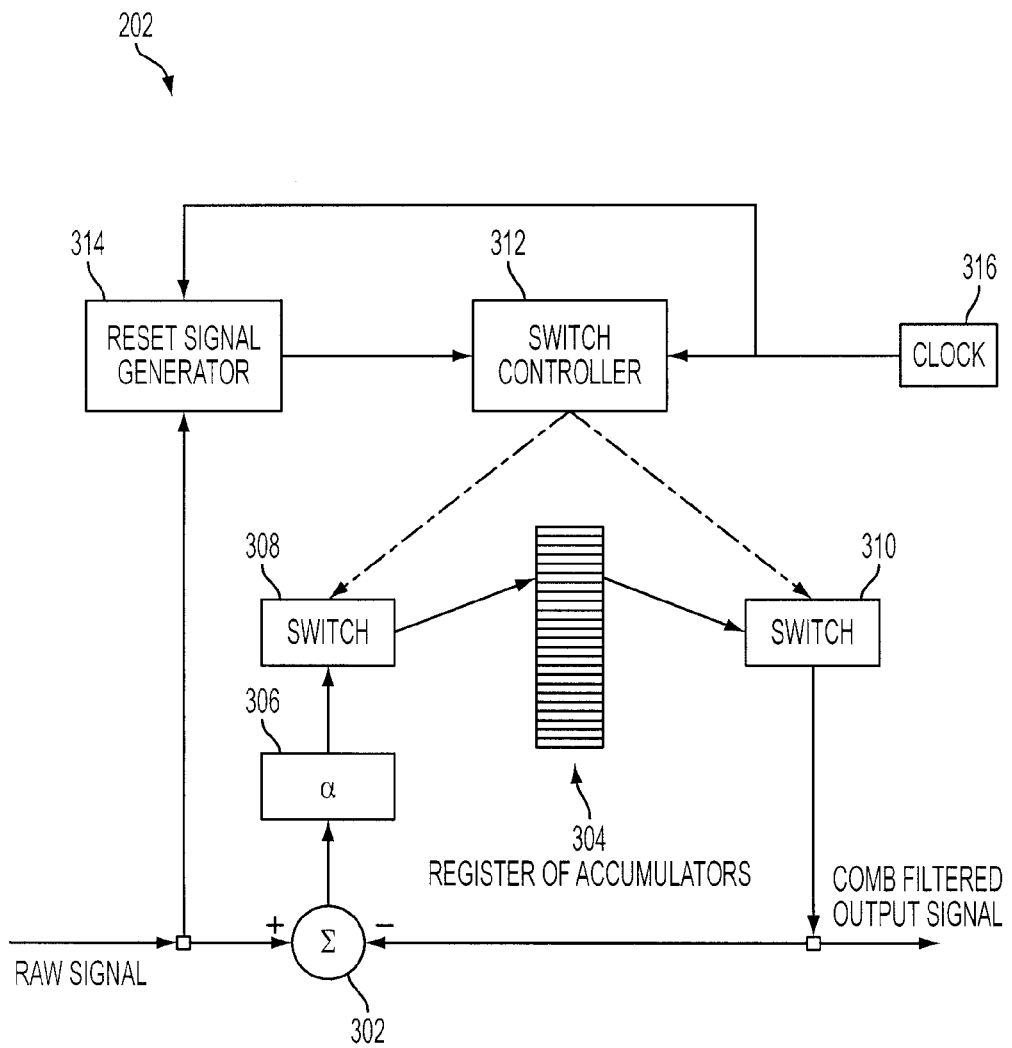
FIG. 3(a) shows a comb filter which can be used as part of an adaptive filter according to an exemplary embodiment.

FIG. 3(a) shows a block diagram of a frequency tracking comb filter 202 according to an exemplary embodiment. The comb filter 202 may be realized by passing the raw signal through a bank of successively switched low pass filters. More specifically, the raw signal is summed with a feedback signal at summer 302. This value is then multiplied by a gain factor a at block 306, which gain factor determines the time constant of the comb filter 202. According to one purely exemplary embodiment, this time constant can be set to 0.5 seconds, however it will be appreciated that other time constants, e.g., in the range of 1/8 of a second to 2 seconds, may also be used depending upon the particular implementation. The resulting value is then accumulated in one of a plurality of accumulators in bank 304. For example, the 60 Hz cycle associated with the power frequency can be divided into 256 segments, each of which has an accumulator in bank 304 associated therewith. The value passed from block 306 can be added to the currently selected accumulator, e.g., selected by switch 308 under control of switch controller 312. The accumulated value of that accumulator is switched out by switch 310, also under control of the switch controller 312. The register of accumulators 304 in conjunction with the switches 308 and 310 thus operate as a series of low pass filters which effectively average waveform values over time synchronously with the fundamental frequency of the current being measured. This synchronization aspect of the comb filter 202 is handled by the reset generator 314.

Figure 3B:
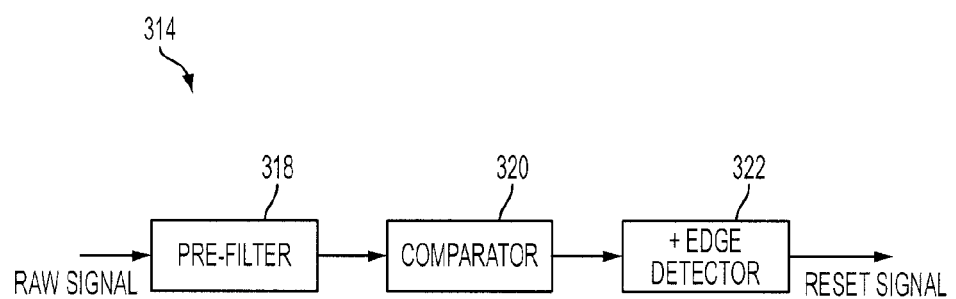
FIG. 3(b) illustrates a reset signal generator according to an exemplary embodiment.

More specifically, by resetting the switches 308, 310 to the beginning of the filter bank synchronously with the fundamental frequency component, the comb is realized. The reset signal may be triggered by the zero crossings of a pre-filtered version of the raw signal as shown in FIG. 3(b). Therein, a pre-filter 318 is provided which heavily filters noise out of the raw signal to generate a relatively "clean" sine function associated with the measured current. This sine function is then compared at block 320 with a sine function at the fundamental frequency of the current being measured (e.g., 60 Hz). Edge detector 322 identifies the zero crossings which generate the reset signal to switch detector 312 to reset its pointer to the beginning of the bank of accumulators 304. The switches 308 and 310 are then controlled to switch in and out the first accumulator and sequence through the bank via clocked control commands. Clock 316 clocks both switch controller 312 and the reset signal generator 314. Additional logic may be applied to only allow the reset frequency to vary slowly to increase the immunity of the frequency tracking function to noise.

Figure 4A:
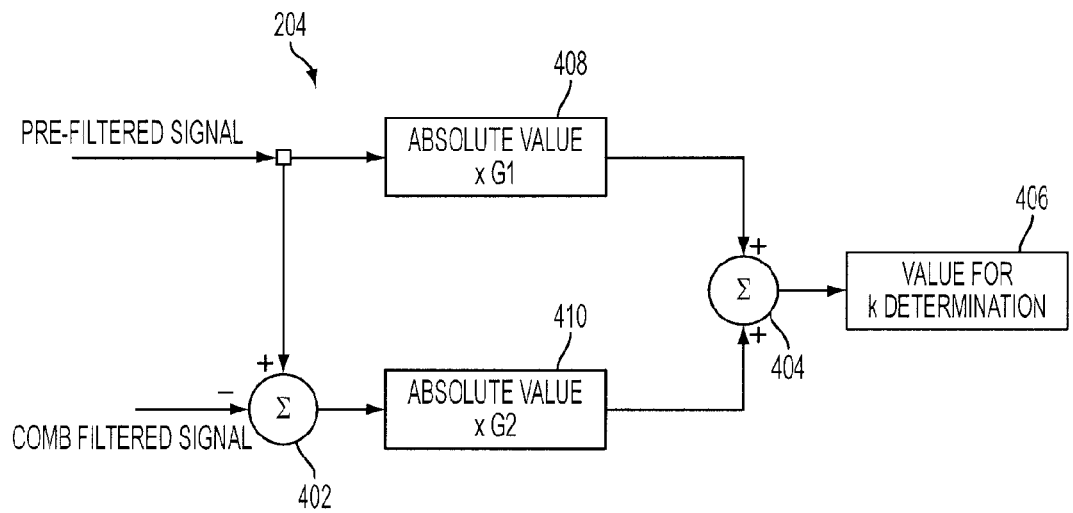
FIG. 4(a) illustrates a comparator for generating a weighting value k according to an exemplary embodiment.

FIG. 4(a) shows a block diagram of one method of implementing the comparator 204 to determine k which, as described above, is used to balance the raw signal and the comb filtered signal in the output of adaptive filter 200. The magnitude of the difference between the raw signal and the comb filtered signal (generated by summer 402) is linearly summed at block 404 with the magnitude of the raw signal to determine the level of k. The inputs to summer 404 can be weighted by factors G1 and G2 at blocks 408 and 410, respectively. If the raw signal is either large, or is much different than the comb filtered signal, e.g., greater than 50 amps for a purely exemplary current sensor having a sensor head with 20 turns of sensing fiber, then k will be set equal to 1 at block 406 and the raw signal is output by the adaptive filter 200. If, on the other hand, the raw signal is both small and close to the comb filtered signal, e.g., less than 15 amps for the same purely exemplary current sensor, then k is set equal to zero at block 406 and the comb filtered signal is output by the adaptive filter 200.

Figure 4B:
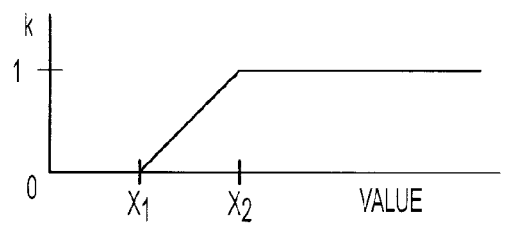
FIG. 4(b) is a graph depicting k as a function of summed values according to an exemplary embodiment.

For in-between cases, a combination of the comb filtered signal and the raw signal is output by setting k equal to a value between zero and one. An example of these three cases is illustrated in FIG. 4(b). Therein, for a value between 0 and X1 output from summer 404, k is set equal to zero. For values between X1 and X2, the value of k varies linearly between 0 and 1. It will be appreciated that, although a smooth transition between outputting the raw signal and the comb filtered signal from adaptive filter 202 is desirable to reduce glitches when the true current transitions from one regime to the other, it is not necessary that the transition be linear, i.e., a non-linear function could be used to generate k between values X1 and X2. The values of G1, G2, X1 and X2 can be determined empirically and set according to the particular implementation. According to one purely illustrative implementation G1=1, G2=0.5, X1=15 amps and X2=50 amps, however these values may be varied.

One advantage of these exemplary systems and methods is that the total noise bandwidth of the sensor is greatly reduced when the true current is small, without rolling off the true harmonics. For example, assume the bandwidth of the current sensor is normally set to 6 kHz. This spans 100 harmonics of the basic 60 Hz power line frequency. However, when the current is small, the comb filter 202 is selected to generate the output of the adaptive filter 200, which may only allow 1 Hz around each of the power frequency harmonics (60, 120, 180, ... 6000 Hz). This, in turn, reduces the noise equivalent bandwidth from 6 kHz to 100 Hz, which reduces the apparent noise by the square root of 6000/100, or by approximately a factor of 8. (The rms white noise present in the fiber optic current sensor is ordinarily proportional to the square root of bandwidth). This in turn allows the optical current sensor according to an exemplary embodiment to effectively measure currents 8 times lower than would be the case without the comb filter. It will be appreciated that these bandwidths are given only by way of example. More or less noise reduction can be obtained with differing amounts of filtering, albeit the drawback of increasing the filtering is that small transients are tracked less well with more filtering.

Numerous variations and permutations of the above-described exemplary embodiment are contemplated. For example, Faraday rotator 58 and quarter-wave plate 60 can be replaced with a birefringence modulator and delay coil. The former combination has the advantage, however, of being a passive device and therefore not requiring power. The optical elements 54, 58 and 60 can be packaged together as a single unit or can be implemented discretely. Additionally, a shield, e.g., a loop of wire, can be placed proximate the Faraday rotator 58 to shield the Faraday rotator against exposure to potentially large magnetic fields, if this portion of the fiber optic current sensor is disposed near the conductor 59. Additionally, the PBS 54 can be replaced with a 3 dB optical coupler and a polarizer. Other variations will also be apparent. Exemplary embodiments of the present invention are useful for applications involving the measurement of voltage associated with electrical power transmission lines and in power substations, however the present invention is not so limited.

Figure 5:
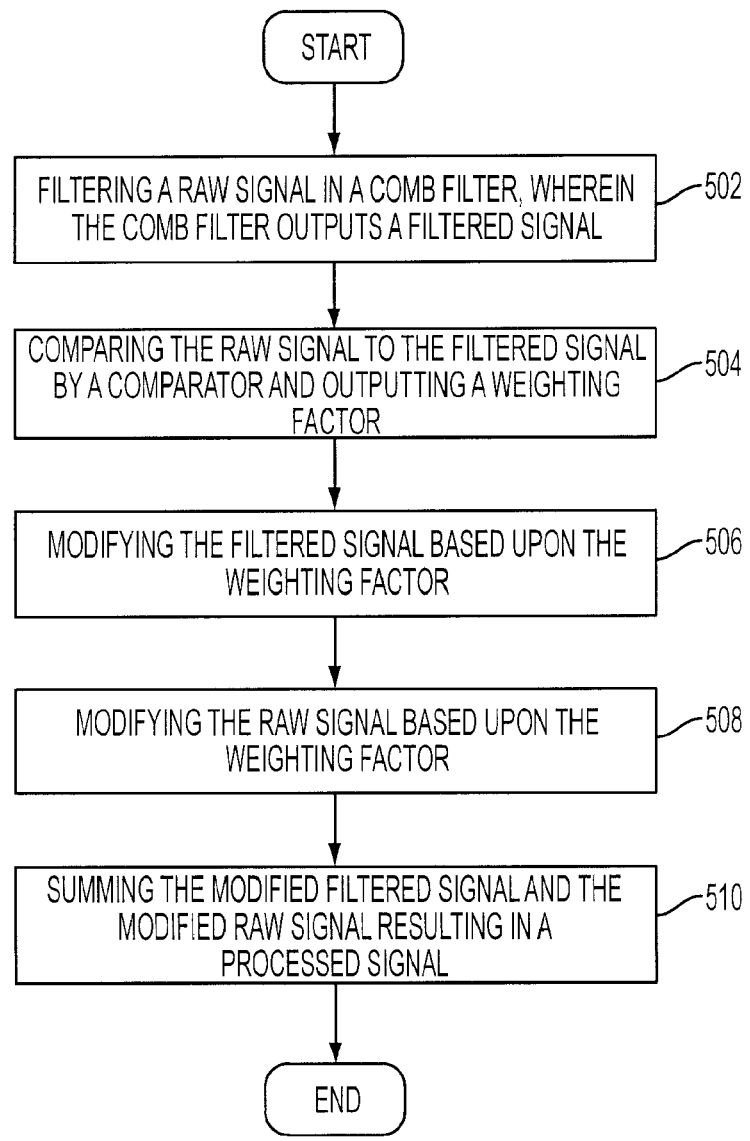
FIG. 5 shows a method flowchart for sensing current or voltage on a high power line according to an exemplary embodiment.

Utilizing the above-described exemplary systems according to exemplary embodiments, a method for sensing current or voltage on a high power voltage is shown in FIG. 5. Initially, a method for sensing current or voltage on a high power voltage line with an adaptive filter includes: filtering a raw signal in a comb filter, wherein the comb filter outputs a filtered signal in step 502; comparing the raw signal to the filtered signal by a comparator and outputting a weighting factor in step 504; modifying the filtered signal based upon the weighting factor in step 506; modifying a raw signal based upon the weighting factor in step 508; and summing the modified filtered signal and the modified raw signal resulting in a processed signal in step 510.

As mentioned above, exemplary embodiments of the present invention associated with optical current sensors employing adaptive filtering as described above can, alternatively, employ a birefringence modulator (as described, for example, in the in the above-incorporated by reference '397 patent) instead of the Faraday rotator 58 illustrated in FIG. 1 to provide the desired bias to the light. In such embodiments, the quarter-wave plate 60 can be omitted since the birefringence modulator operates on linearly polarized light.

According to the above-described exemplary embodiments, the adaptive filter 70 outputs one of the raw signal, the comb-filtered signal or a weighted combination of the raw signal and the comb-filtered signal. However, according to other exemplary embodiments, it may be useful to provide a fourth option for output as the processed signal, specifically when the raw, sensed current is very low, e.g., below 0.5 amps or below 1 amp. Under these circumstances, for some exemplary embodiments, it may be preferable to either output zero as the processed signal or to output the pre-filtered signal (i.e., the output of block 206 in FIG. 2) as the processed signal. Additionally, it will be appreciated that the foregoing examples illustrate the usage of a frequency tracking comb filter in conjunction with an optical current sensor and/or an optical voltage sensor. However, other types of filters, e.g., adaptive bandpass filters, can be used instead as long as they filter the detected output in a manner which preserves a response of a fundamental power frequency of the current or voltage which is being measured.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims. No element, act, or instruction used in the description of the present application should be construed as critical or essential to the invention unless explicitly described as such. Also, as used herein, the article "a" is intended to include one or more items.

What is claimed is:

1. A fiber optic current sensor comprising:
    a light source;
    a polarization beam splitter connected to said light source having a reciprocal port and a non-reciprocal port;
    a Faraday rotator connected to said polarization beam splitter;
    a first quarter-wave plate connected to said Faraday rotator;
    a polarization maintaining fiber connected to said first quarter-wave plate;
    a second quarter-wave plate connected to said polarization maintaining fiber;
    a sensing fiber connected to said second quarter-wave plate;
    a detector connected to said polarization beam splitter via said non-reciprocal port and having an output; and
    an adaptive filter for filtering said output,
    wherein said adaptive filter includes a comb filter,
    further wherein said comb filter includes a register containing accumulators and a switch connected to said register.

2. The fiber optic current sensor of claim 1, wherein said comb filter is a frequency tracking comb filter.

3. The fiber optic current sensor of claim 1, wherein said adaptive filter uses a value to weight a comb filtered output to generate a weighted version of said comb filtered output and combines said weighted version of said comb filtered output with a weighted version of said detector output to generate a processed signal.

4. The fiber optic current sensor of claim 3, wherein said value is generated by a comparator which compares said comb filtered output to said detector output.

5. The fiber optic current sensor of claim 1, wherein said adaptive filter uses a value to weight a comb filtered output to generate a weighted version of said comb filtered output and combines said weighted version of said comb filtered output with a weighted version of said detector output to generate a processed signal.

6. The fiber optic current sensor of claim 5, wherein said value is generated by a comparator which compares said comb filtered output to said detector output.

7. The fiber optic current sensor of claim 1, wherein said adaptive filter is configured to receive a raw signal and output a comb filtered signal, and further comprises:
    a comparator for comparing said raw signal to said comb filtered signal to determine a weighting value;
    a first gain block for modifying said comb filtered signal based on said weighting value;
    a second gain block for modifying said raw signal based on said weighting value; and
    a combiner for creating a processed signal from outputs of said first and second gain blocks.

8. The fiber optic current sensor of claim 7, further comprising:
    a pre-filter for filtering said raw signal prior to said raw signal arriving at said comparator.

9. The fiber optic current sensor of claim 7, wherein said comb filter is a frequency tracking comb filter and further comprising:
    a summer for generating an output from summing said raw signal and a feedback signal;
    a gain multiplier block for multiplying said output with a gain factor;
    a switch controller which controls a pair of switches for switching values in and out of said register containing accumulators, wherein said pair of switches in conjunction with said register containing accumulators operate as a series of low pass filters;
    a reset signal generator; and
    a clock.

10. A fiber optic current sensor comprising:
    a source which generates light;
    a biasing element for biasing said light;
    a polarization maintaining fiber connected to said biasing element;
    a quarter-wave plate connected to said polarization maintaining fiber;
    a sensing fiber connected to said quarter-wave plate;
    a reflector connected to said sensing fiber;
    a coupler connected to said light source and to a detector, wherein said detector receives light returning from said reflector and generates an output associated therewith; and
    an adaptive filter for filtering said output,
    wherein said adaptive filter includes a comb filter,
    further wherein said comb filter includes a register containing accumulators and a switch connected to said register.

11. The fiber optic current sensor of claim 10, wherein said biasing element is one of a Faraday rotator and a birefringence modulator.

12. The fiber optic current sensor of claim 10, wherein said adaptive filter is a frequency tracking comb filter.

13. The fiber optic current sensor of claim 10, wherein said adaptive filter uses a value to weight a comb filtered output to generate a weighted version of said comb filtered output and combines said weighted version of said comb filtered output with a weighted version of said detector output to generate a processed signal.

14. The fiber optic current sensor of claim 13, wherein said value is generated by a comparator which compares said comb filtered output to said detector output.

15. The fiber optic current sensor of claim 10, wherein said adaptive filter is configured to receive a raw signal and output a comb filtered signal, and further comprises:
    a comparator for comparing said raw signal to said comb filtered signal to determine a weighting value;
    a first gain block for modifying said comb filtered signal based on said weighting value;
    a second gain block for modifying said raw signal based on said weighting value; and
    a combiner for creating a processed signal from outputs of said first and second gain blocks.

16. The fiber optic current sensor of claim 15, further comprising:
    a pre-filter for filtering said raw signal prior to said raw signal arriving at said comparator.

17. The fiber optic current sensor of claim 15, wherein said comb filter is a frequency tracking comb filter and further comprising:
    a summer for generating an output from summing said raw signal and a feedback signal;
    a gain multiplier block for multiplying said output with a gain factor;
    a switch controller which controls a pair of switches for switching values in and out of said register containing accumulators, wherein said pair of switches in conjunction with said register containing accumulators operate as a series of low pass filters;
    a reset signal generator; and
    a clock.

* * * * *